(12) United States Patent
Lin

(10) Patent No.: US 7,558,067 B2
(45) Date of Patent: Jul. 7, 2009

(54) RETAINING TOOL FOR A HEAT SINK

(75) Inventor: Sheng-Huang Lin, Kaohsiung (TW)

(73) Assignee: Asia Vital Conponents Company Ltd., Kaohsiung (TW)

(*) Notice: Subject to any disclaimer, the term of this patent is extended or adjusted under 35 U.S.C. 154(b) by 258 days.

(21) Appl. No.: 11/742,597

(22) Filed: May 1, 2007

(65) Prior Publication Data
US 2008/0273309 A1 Nov. 6, 2008

(51) Int. Cl.
H05K 7/20 (2006.01)
F28F 7/00 (2006.01)
A44B 21/00 (2006.01)

(52) U.S. Cl. ............... 361/710; 165/80.2; 165/80.3; 165/185; 257/719; 361/709; 361/719; 361/679.54; 24/459; 248/505; 248/510

(58) Field of Classification Search ............ 24/459; 248/510; 257/718–719; 361/718, 719, 709, 361/710, 679.54
See application file for complete search history.

(56) References Cited

U.S. PATENT DOCUMENTS

| 5,953,212 | A | * | 9/1999 | Lee | 361/709 |
|---|---|---|---|---|---|
| 6,108,207 | A | * | 8/2000 | Lee | 361/704 |
| 6,111,752 | A | * | 8/2000 | Huang et al. | 361/704 |
| 6,181,559 | B1 | * | 1/2001 | Seo | 361/704 |
| 6,250,375 | B1 | * | 6/2001 | Lee et al. | 165/80.3 |
| 6,418,022 | B1 | * | 7/2002 | Chen | 361/704 |
| 6,421,242 | B1 | * | 7/2002 | Chen | 361/704 |
| 6,731,504 | B1 | * | 5/2004 | Liu | 361/704 |
| 6,754,080 | B2 | * | 6/2004 | Lee et al. | 361/710 |
| 6,775,138 | B2 | * | 8/2004 | Lee et al. | 361/697 |
| 6,826,052 | B2 | * | 11/2004 | Ma | 361/709 |
| 6,876,551 | B2 | * | 4/2005 | Lee et al. | 361/702 |
| 7,061,764 | B2 | * | 6/2006 | Lai et al. | 361/704 |
| 7,292,442 | B2 | * | 11/2007 | Yu et al. | 361/704 |
| 7,292,444 | B1 | * | 11/2007 | Yang et al. | 361/709 |
| 7,310,229 | B2 | * | 12/2007 | Lee et al. | 361/697 |
| 7,391,615 | B2 | * | 6/2008 | Fu et al. | 361/704 |
| 7,397,663 | B2 | * | 7/2008 | Chen et al. | 361/704 |
| 7,430,121 | B2 | * | 9/2008 | Lu et al. | 361/719 |

(Continued)

FOREIGN PATENT DOCUMENTS

DE 29612047 U1 * 9/1996

Primary Examiner—Anatoly Vortman

(57) ABSTRACT

A retaining tool for a heat sink includes a frame, at least an operation member and at least an engaging member. The frame is attached to an upper portion of the heat sink with a projection at two opposite sides thereof and the projection has a contact face. The operation member provides a main operation part and a stir part. The main operation part is disposed on top of the contact face and the stir part is angularly lifted for the main operation part being capable of moving relative to the contact face. The engaging member further has a follower part piercing the projection with an end of the follower part connecting with the main operation part pivotally and another end of the follower part being joined to a first elastic part and a second elastic part respectively. The first elastic part extends curvedly a circular bend outward the heat sink and the second elastic part extending curvedly another bend inward the heat sink and free ends of both the elastic parts are joined to two opposite lateral sides of an engaging part for controlling the engaging force evenly and decreasing plastic deformation.

13 Claims, 7 Drawing Sheets

U.S. PATENT DOCUMENTS

| | | | |
|---|---|---|---|
| 7,467,443 B2 * | 12/2008 | Lin | 24/459 |
| 2005/0024832 A1 * | 2/2005 | Lee et al. | 361/704 |
| 2007/0025083 A1 * | 2/2007 | Lin | 361/704 |
| 2007/0115638 A1 * | 5/2007 | Yu et al. | 361/704 |

* cited by examiner

RETAINING TOOL FOR A HEAT SINK

BACKGROUND OF THE INVENTION

1. Field of the Invention

The present invention is related to a retaining tool for a heat sink and particularly to a device for fixing a heat sink.

2. Brief Description of the Related Art

The prior art such as Taiwan Utility Model publication No. 092205232 entitled "Retaining Tool for Heat Dissipation Component" provides a retaining tool being disposed in a locating recess of two opposite sides of a heat dissipation component. The retaining tool has an engaging plate, which is slid into the locating recess with the upper section thereof, providing an elastic part at the middle section thereof and providing an engaging hole at the lower section thereof for engaging a locking ear of a connecting base. The retaining tool further has an operation lever, which provides an actuation plate part being eccentrically joined to the upper section of the engaging plate and the outer contour is disposed on top of the heat dissipation component. Hence, the operation lever is stirred angularly and the actuation plate is capable of lifting the engaging plate such that the engaging plate can hook the locking ear tightly to allow the bottom of the heat dissipation component closely contacting a chip underneath. The actuation plate has a shaft hole disposed at a side of the actuation part for a pivotal pin being joined to the upper section of the engaging plate and has a handle part extending outward from the actuation plate. The elastic part has a shape of "S" or the like.

However, the problem of the preceding prior art is in that the elastic part has an insufficient angular bend due to space limitation of a host unit of the computer and it results in too little module of elasticity, which is easy to create plastic deformation while in use.

SUMMARY OF THE INVENTION

In order to overcome the preceding disadvantages, an object of the present invention is to provide a retaining tool for a heat sink with which more module of elasticity is provided in a very limited space and easily controlled engaging force with good elastic restoration can be obtained so as to reduce possibility of plastic deformation.

Accordingly, a retaining tool for a heat sink includes a frame, at least an operation member and at least an engaging member. The frame is attached to an upper portion of the heat sink with a projection at two opposite sides thereof and the projection has a contact face. The operation member provides a main operation part and a stir part. The main operation part is disposed on top of the contact face and the stir part is angularly lifted for the main operation part being capable of moving relative to the contact face. The engaging member further has a follower part piercing the projection with an end of the follower part connecting with the main operation part pivotally and another end of the follower part being joined to a first elastic part and a second elastic part respectively. The first elastic part extends curvedly a circular bend outward the heat sink and the second elastic part extending curvedly another bend inward the heat sink and free ends of both the elastic parts are joined to two opposite lateral sides of an engaging part for controlling the engaging force evenly and decreasing plastic deformation.

BRIEF DESCRIPTION OF THE DRAWINGS

The detail structure, the applied principle, the function and the effectiveness of the present invention can be more fully understood with reference to the following description and accompanying drawings, in which.

DETAILED DESCRIPTION OF THE INVENTION

Figure 1:
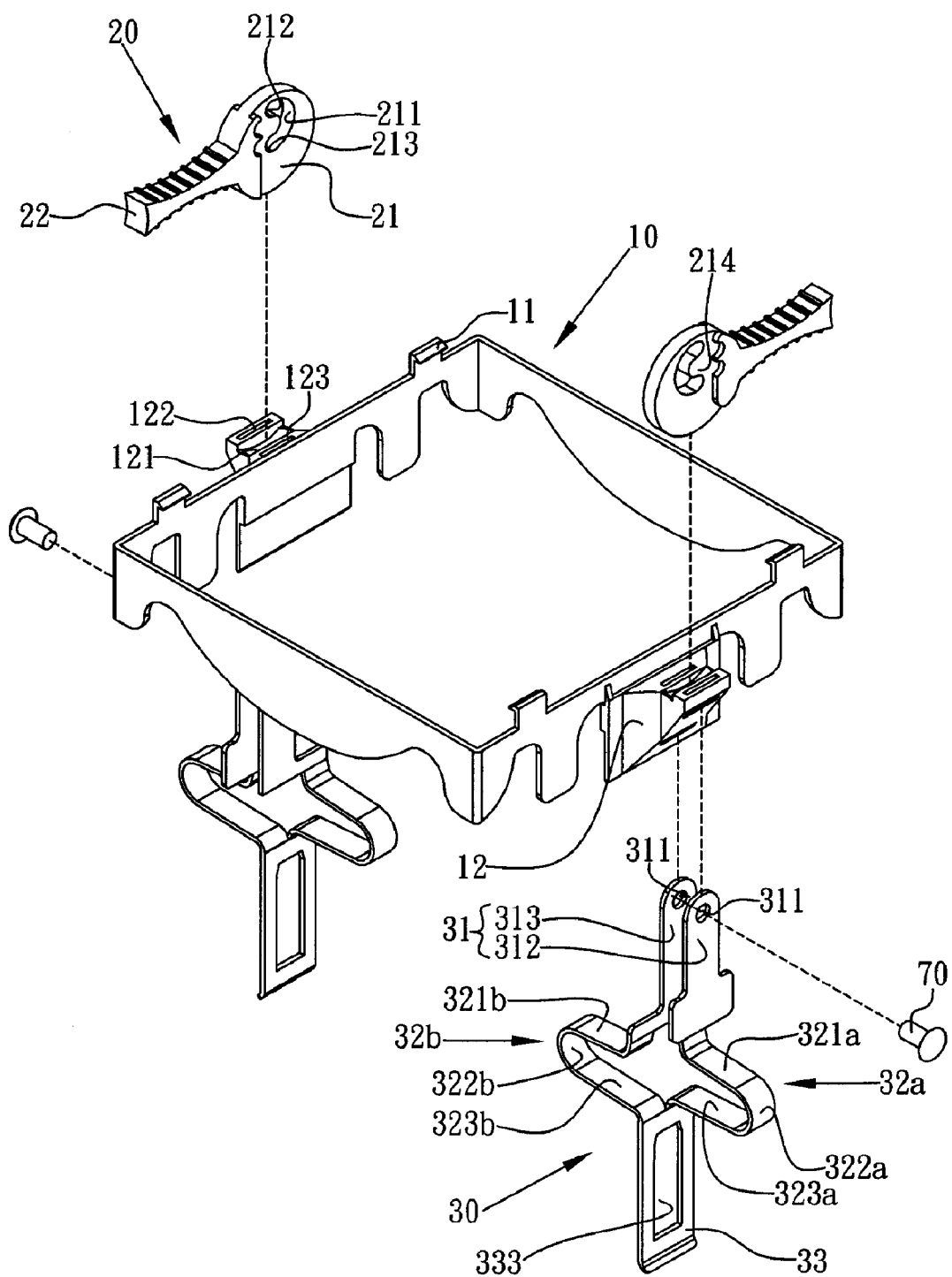
FIG. 1 is a disassembled perspective view of a retaining tool for a heat sink according to the present invention.
Figure 2:
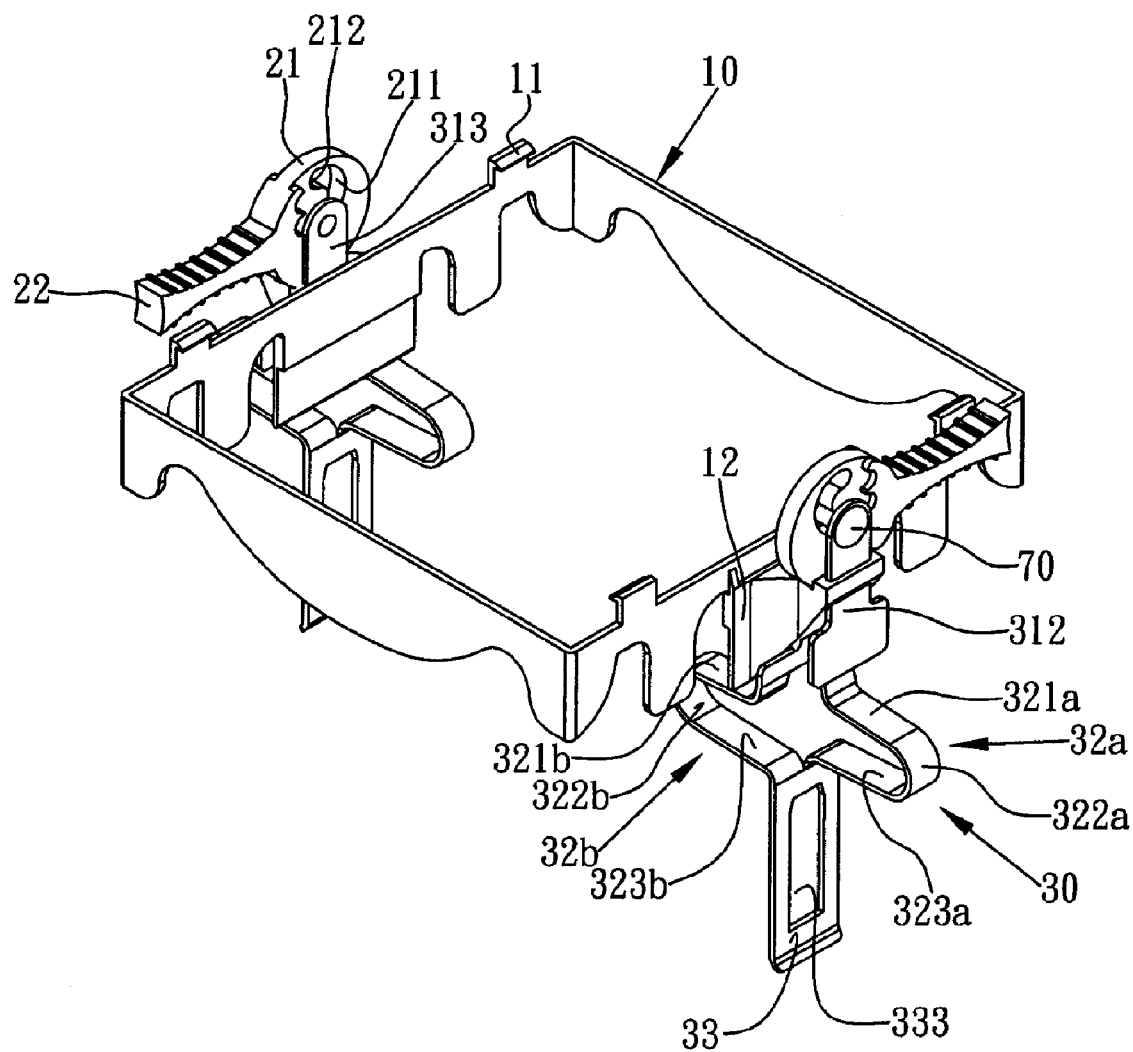
FIG. 2 is an assembled perspective view of the retaining tool shown in FIG. 1.

Referring to FIGS. 1 and 2, the preferred embodiment of a retaining tool for a heat sink according to the present invention includes a frame 10, at least an operation member 20 and at least an engaging member 30. The frame 10 is hollow and provides four enclosed frame edges. Two opposite ones of the frame edges each provide two inverted hooks 11 respectively for engaging a fan (not shown) and extend outward a projection 12 from the middle section thereof. The projection 12 has a contact face 121 with two slots 122, 123.

The operation member 20 is provided to correspond to the respective projection 12 and includes a main operation part 21 and a stir part 22 extending from the main operation part 21. The main operation part 21 is disposed on top of the contact face 121 of the respective projection 12. The stir part 22 is actuated to rotate the main operation part 21 such that the main operation part 21 is capable of moving relative to the contact face 121.

The main operation part 21 is of circular disk shape with a guide groove 211 being provided therein to pierce two opposite lateral sides thereof and the guide groove 211 has a first end 212 and a second end 213. The guide groove 211 curvedly extends along radial direction of the main operation part 21 from the first end 212 to the second end so as to create a uvula 214 between the first end 212 and the second end 213.

The main operation part 21 can be acted as an eccentric cam instead and the contact face 121 of the projection 12 is concaving downward to contact the main operation part 21 such that the main operation part 21 is capable of rotating on the contact face 121 steadily.

The engaging member 30 has a follower part 31 extending vertically. A first elastic part 32a and a second elastic part 32b are oppositely disposed at the lower end of the follower part 31. An end of the respective elastic parts 32a, 32b extends downward to connect an engaging plate 33.

The follower part 31 is composed of a first elongated plate 312 and a second elongated plate 313 with a pivot hole 311 at an end of the respective elongated plate 312, 313 and the end with the pivot hole 311 of the respective elongated plate 312, 313 is inserted through the slots 122, 123 of the projection 12 such that the first and second elongated plates 312, 313 are disposed at two lateral sides of the main operation part 21 respectively. Further, a pivot 70 passes through the pivot hole 311 and the guide groove 211. In this way, the operation member 20 is capable of actuating the follower part 31 to move upward and downward.

Further, another ends of the elongated plates 312, 313 are joined to a first and a second elastic parts 32a, 32b. The first elastic part 32a extends outward the frame 10 and the second part 32b extends inward the frame 10. The first and second elastic parts 32a, 32b each include a first elastic strip section 321a, 321b extending a circular bend 322a, 322b respectively and the circular bends 322a, 322b further extend a second elastic strip section 323a, 323b respectively. The lower end of the respective second elastic strip section 323a, 323b extends vertically to form an engaging part 33 with an engaging hole 333.

Further, it is noted that the first and second elastic parts can be formed in a shape of "U" or "C" instead of the configuration shown in the figures. In addition, the engaging plate 33 can be made integrally with the first and second elastic parts 32a, 32b.

Figure 3:
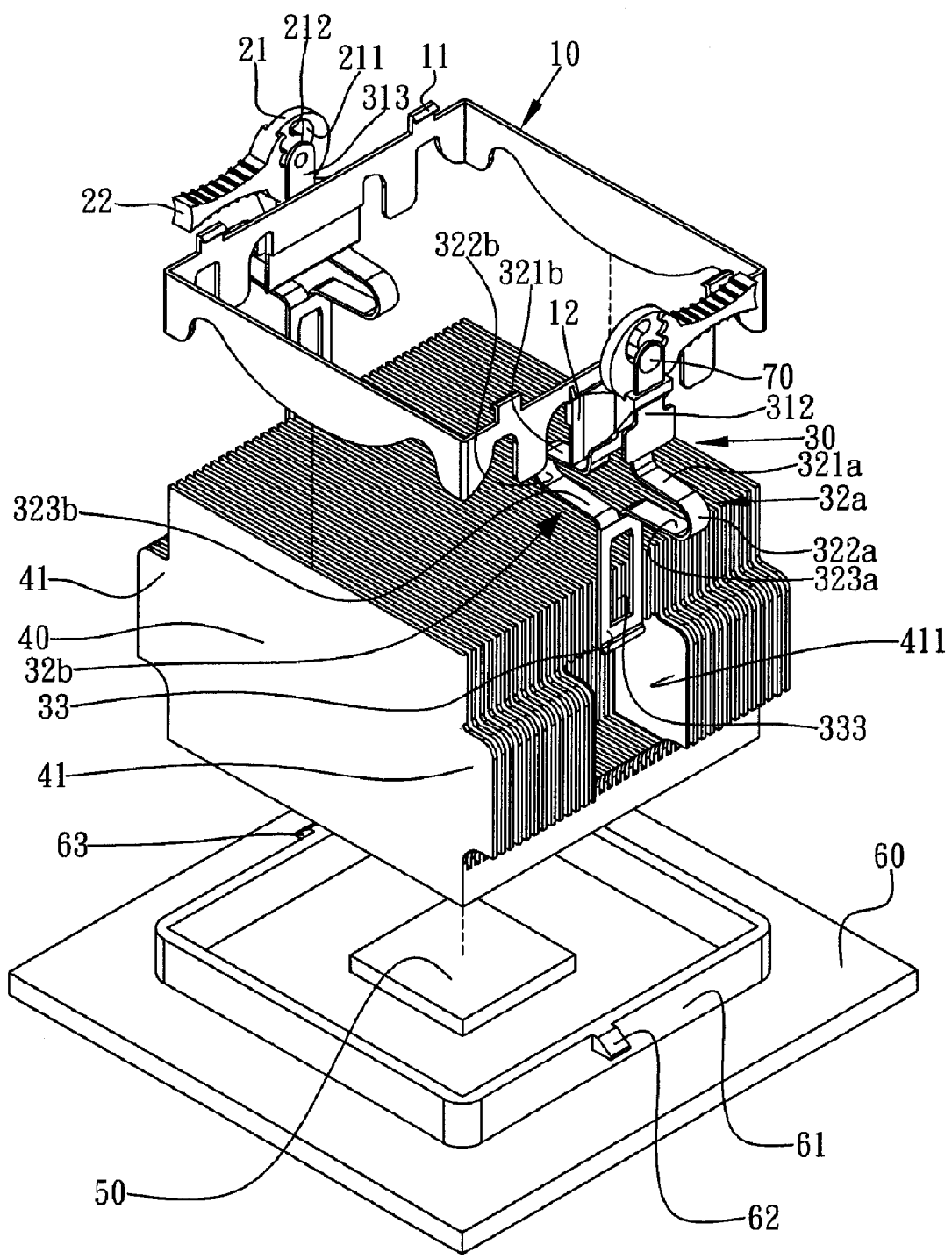
FIG. 3 is a disassembled perspective view illustrating the retaining tool of the present invention in association with a heat sink and a heat generating component.
Figure 4:
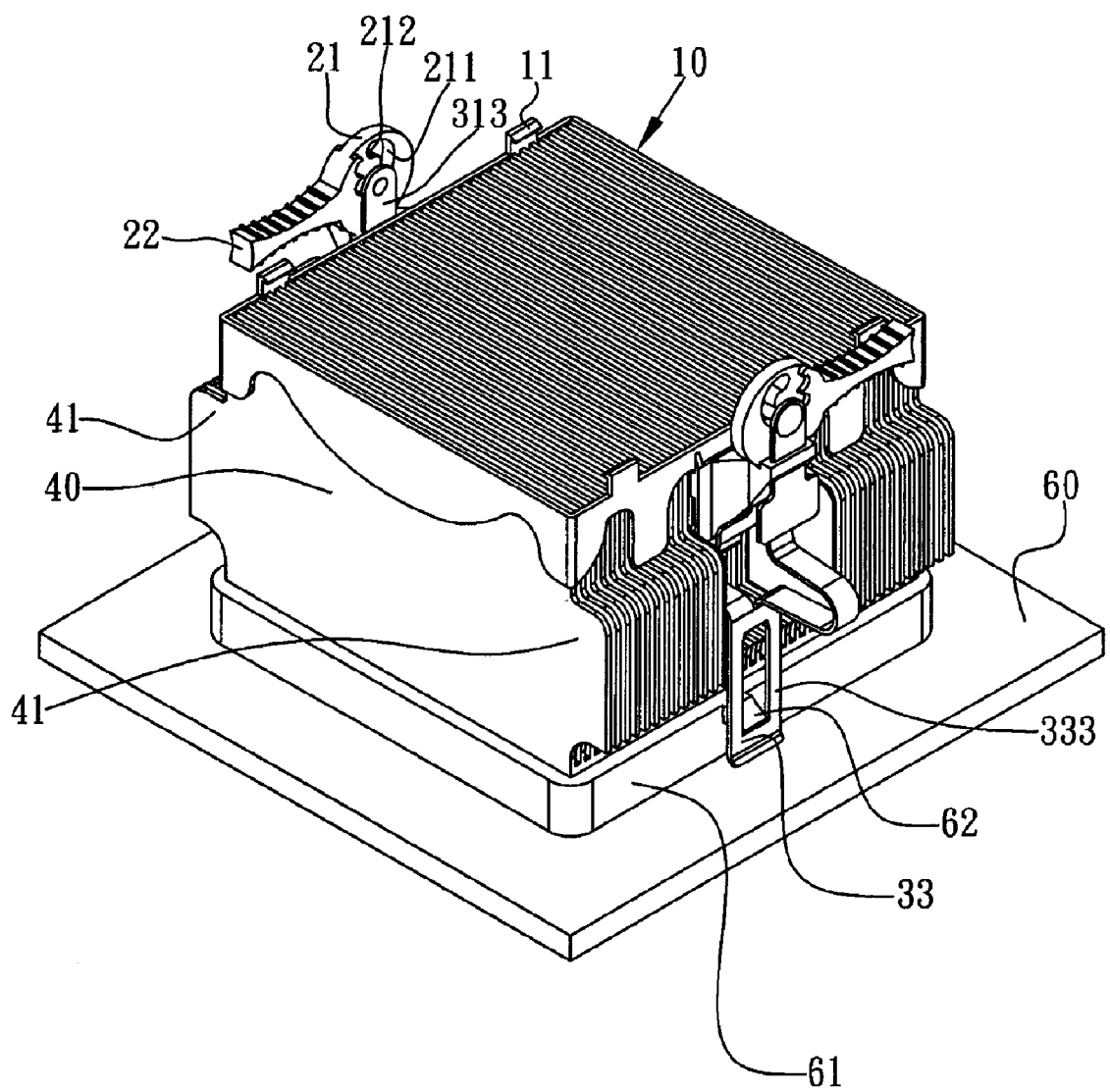
FIG. 4 is an assembled perspective view of FIG. 3.

Referring to FIGS. 3 and 4, the retaining device of the present invention is employed to allow the bottom of a heat sink 40 to tightly contact with a heat generating unit 50. The heat sink 40 is made of metal with good heat conductivity such as aluminum or copper and provides a plurality of fins to increase heat dissipating area. Alternatively, the heat sink 40 can be made with extruded aluminum, pressed cast or folded type with a shape other than the heat sink 40 shown in the figures and a heat pipe can be inserted through the heat sink 40. Besides, two opposite sides of the heat sink 40 have a protrusion part 41 respectively and once the heat sink 40 is placed on the heat generating component 50, heat from the heat generating component 50 can be transmitted via the heat sink 40 to assist with heat dissipation.

The heat generating component 50 such as CPU is arranged on a circuit board 60, which has a locating base 61 surrounding the heat generating component 50 and provides an engaging lug 62, 63 at two opposite sides thereof for engaging with the engaging hole 333 of the engaging plate 33 respectively.

The frame 10 is attached to the upper portion of the heat sink 40 and the engaging member 30 are disposed at two opposite sides of the heat sink 40 in a recess 411 next to the protrusion 41 while the retaining device of the present invention is employed to engage the heat sink 40 to the heat generating component 50. Further, the engaging hole 333 of the engaging plate 33 engages with the engaging lugs 62, 63 respectively so the lower side of the frame 10 held by the protrusion 41. Under this circumstance, the engaging force of the engaging member 30 exerts to the heat sink 40 and the heat sink 40 is capable of keeping contact tightly with the heat dissipating component 50.

Figure 5:
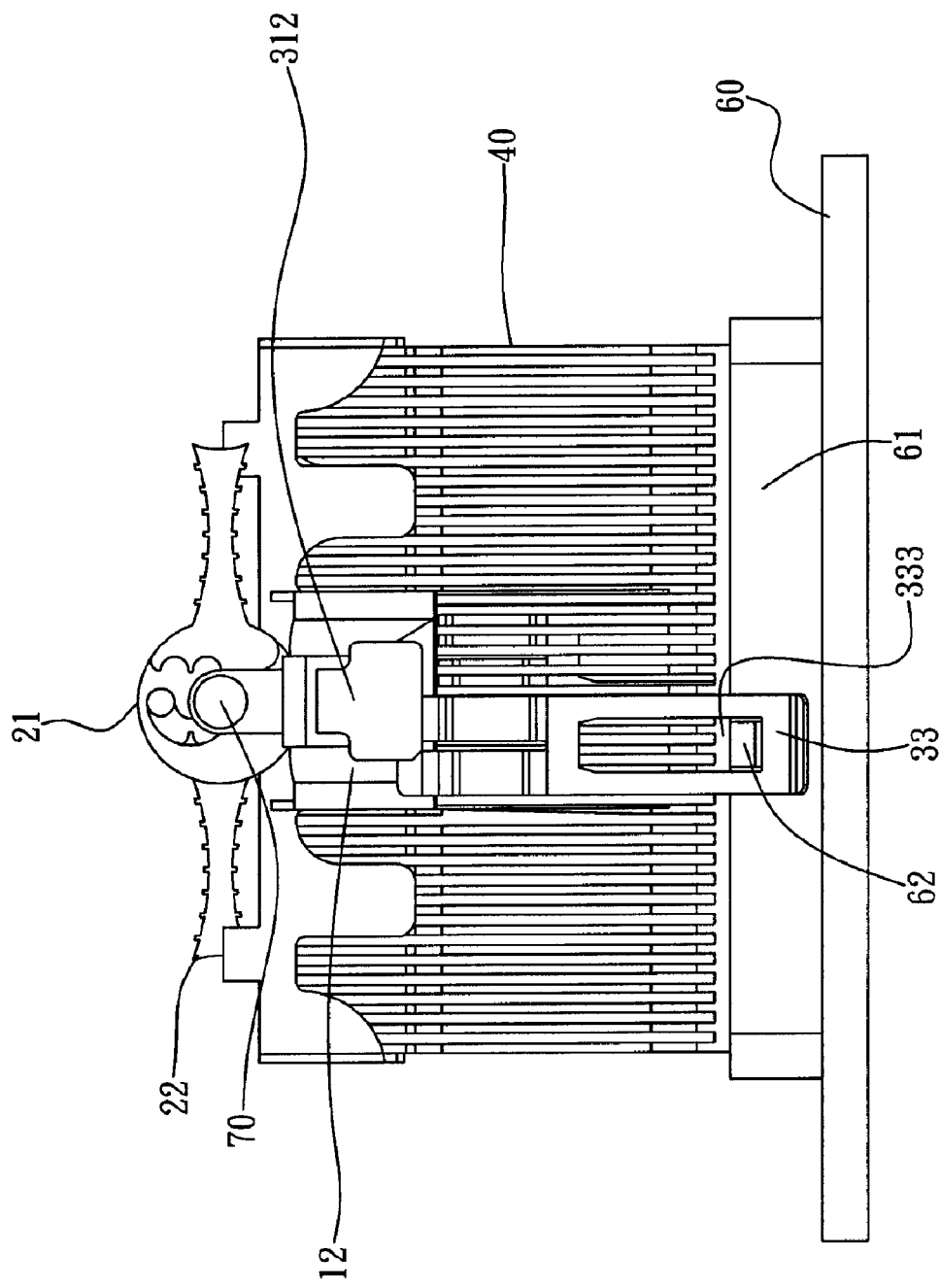
FIG. 5 is a plan view illustrating the retaining tool engaging with the engaging lug.
Figure 6:
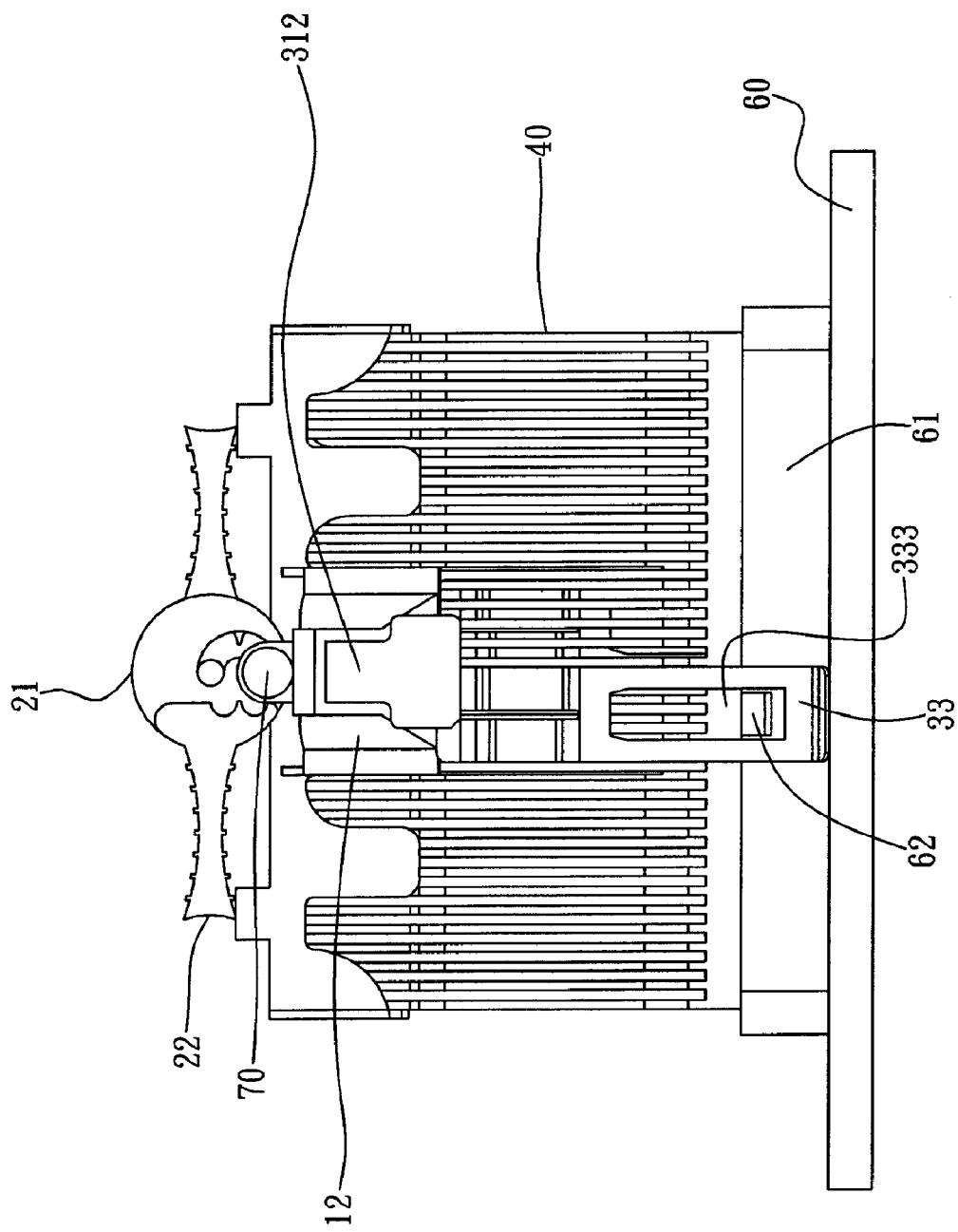
FIG. 6 is a plan view illustrating the retaining tool releasing the engaging lug.
Figure 7:
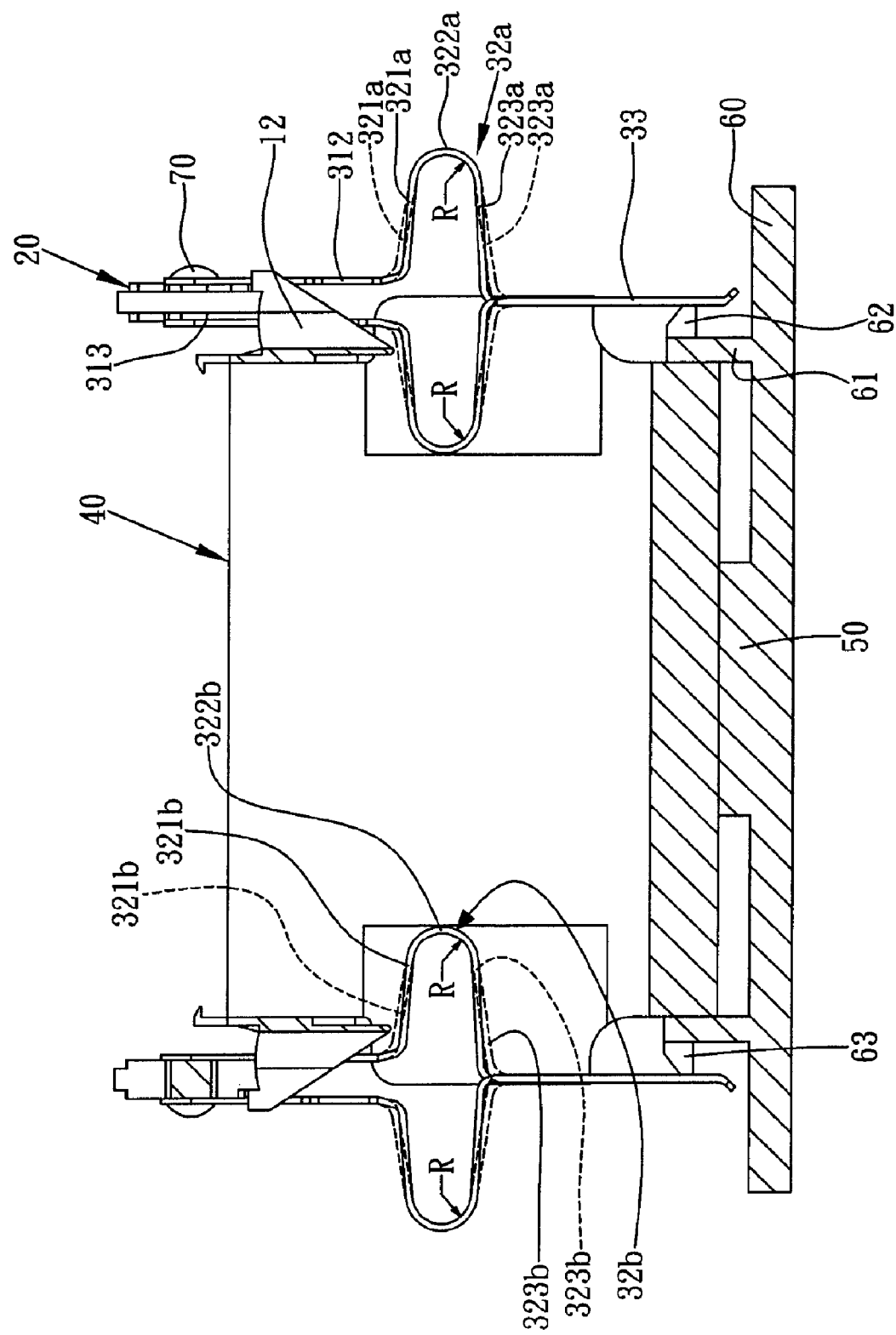
FIG. 7 is a plan view illustrating the first elastic member and the second elastic member of the retaining tool while in a state of engaging and releasing.

Referring to FIG. 5 and FIG. 3, the engaging member 30 is in a state of tightening and the first and second elastic parts 32a, 32b are lifted upward with the first and second elongated strip sections 312, 313 such that the first elastic strip sections 321a, 321b and the second elastic strip sections 323a, 323b are forcedly expanded upward and downward elastically relative to the circular bands 322a, 322b as shown by dash lines in FIG. 7. Besides, it can be seen in FIG. 6 that if the engaging member 30 is released, the elastic parts 32a, 32b restore the original state thereof and the first elastic strip section 321a, 321b and the second elastic strip sections 323a, 323b move back resiliently as shown by solid lines in FIG. 7. In this way, the engaging hole 333 is capable of being free from the engaging lugs 62, 63. The engaging member 30 being tightened or released can control the engaging force of the engaging plate 33 due to the circular bends 322a, 322b providing a radius R. In addition, the first and second elastic parts 32a, 32b are disposed in a recess 411 at the two opposite sides of the heat sink 40 such that the problem of space limitation created in the prior art can be overcome and the circular bends 322a, 322b can be provided with a greater radius respectively for controlling the engaging force of the engaging part 33 resulting in more module of elasticity than in the prior art for plastic deformation being incapable of occurring during the engaging member 30 being tightened and having better elastic restoration during the engaging member 30 being released.

While the invention has been described with referencing to preferred embodiments thereof, it is to be understood that modifications or variations may be easily made without departing from the spirit of this invention, which is defined by the appended claims.

What is claimed is:

1. A retaining tool for a heat sink comprising:
    a frame being attached to an upper portion of the heat sink, providing a projection at two opposite sides thereof and the projection having a contact face;
    at least an operation member providing a main operation part and a stir part, the main operation part being disposed on top of the contact face and the stir part being lifted angularly for the main operation part being capable of moving relative to the contact face; and
    at least an engaging member further comprising a follower part piercing the projection with an end of the follower part connecting with the main operation part pivotally and another end of the follower part being joined to a first elastic part and a second elastic part, and the first elastic part curvedly extending outward the heat sink and the second elastic part curvedly extending inward the heat sink with a free end of the respective elastic part being joined to two opposite lateral sides of an engaging part.

2. The retaining tool for a heat sink as defined in claim 1, wherein the projection provides a through slot from two sides of the contact face to allow an upper end of the follower part piercing the slot and being disposed at two opposite lateral sides of main operation part.

3. The retaining tool for a heat sink as defined in claim 1, wherein the follower part is pivotally joined to an eccentric point of the main operation part.

4. The retaining tool for a heat sink as defined in claim 1, wherein the main operation part has an eccentric disk shape.

5. The retaining tool for a heat sink as defined in claim 1, wherein the main operation part has a circular disk shape.

6. The retaining tool for a heat sink as defined in claim 1, wherein the main operation part is circular disk shape with a guide groove being provided in the main operation part to pierce the two opposite lateral sides thereof and a uvula being formed between the first and second end such that the follower part pivotally connects with the guide groove by means of a pivot.

7. The retaining tool for a heat sink as defined in claim 1, wherein the engaging part is integrally made with the first and second elastic parts.

8. The retaining tool for a heat sink as defined in claim 1, wherein the first and second elastic parts provide a circular bend to be opposite to each other.

9. The retaining tool for a heat sink as defined in claim 1, wherein the follower part provides a first elongated plate and a second elongated plate and the first elongated plate is joined to the first elastic part and the second elongated plate is joined to the second elastic part.

10. The retaining tool for a heat sink as defined in claim 9, wherein the first and second elongated plates are integrally made with the first and second elastic parts.

11. The retaining tool for a heat sink as defined in claim 1, wherein the first and second elastic parts each provides a first elastic strip to curvedly extend a circular bend and then straightly extends downward a second elastic strip to connect the engaging part respectively.

12. The retaining tool for a heat sink as defined in claim 1, wherein the heat sink provides a protrusion part with a middle recess at two opposite sides thereof such that the bottom of the frame rests on the protrusion and the recess corresponds to the engaging member.

13. The retaining device for a heat sink as defined in claim 1, wherein the contact face provides a concave downward shape.

* * * * *